United States Patent [19]
Hacker et al.

[11] Patent Number: 6,043,330
[45] Date of Patent: Mar. 28, 2000

[54] SYNTHESIS OF SILOXANE RESINS

[75] Inventors: Nigel P. Hacker, San Martin; Lisa K. Figge, Menlo Park; Scott Lefferts, Sunnyvale, all of Calif.

[73] Assignee: AlliedSignal Inc., Morristown, N.J.

[21] Appl. No.: 09/055,244

[22] Filed: Apr. 6, 1998

Related U.S. Application Data

[63] Continuation-in-part of application No. 09/044,831, Mar. 20, 1998, and application No. 09/044,798, Mar. 20, 1998.
[60] Provisional application No. 60/044,480, Apr. 21, 1997.
[51] Int. Cl.$^7$ .......................... C08G 77/06; C08G 77/08; C08G 77/12
[52] U.S. Cl. .................................. 528/12; 528/10; 528/21
[58] Field of Search ...................... 528/10, 21, 12

[56] References Cited

U.S. PATENT DOCUMENTS

| | | | |
|---|---|---|---|
| 3,615,272 | 10/1971 | Collins et al. | 423/325 |
| 4,624,870 | 11/1986 | Anthony | 427/387 |
| 5,010,159 | 4/1991 | Bank et al. | 528/23 |
| 5,063,267 | 11/1991 | Hanneman et al. | 524/284 |
| 5,145,723 | 9/1992 | Ballance et al. | 427/397.7 |
| 5,336,532 | 8/1994 | Haluska et al. | 427/515 |
| 5,416,190 | 5/1995 | Mine et al. | 528/492 |
| 5,486,564 | 1/1996 | Mine et al. | 524/588 |
| 5,670,596 | 9/1997 | Razzano et al. | 528/16 |

FOREIGN PATENT DOCUMENTS

| | | |
|---|---|---|
| 0 576 166 A2 | 12/1993 | European Pat. Off. . |
| 0 652 246 A1 | 5/1995 | European Pat. Off. . |
| 2 199 817 | 7/1988 | United Kingdom . |

OTHER PUBLICATIONS

*Encyclopedia of Chemical Technology*, 4th Edition, John Wiley & Sons, Inc., 1995, vol. 14, p. 177.

*Primary Examiner*—Robert Dawson
*Assistant Examiner*—Jeffrey B. Robertson
*Attorney, Agent, or Firm*—Skjerven, Morrill, MacPherson, Franklin and Friel

[57] ABSTRACT

Novel processes for preparing hydridosiloxane and organohydridosiloxane resins are disclosed. The processes of the invention broadly provide for the steps of contacting a silane monomer with a phase transfer catalyst in the presence of a reaction mixture that includes a nonpolar, e.g., hydrocarbon, solvent, and a polar solvent, e.g., alcohol and water. The process is conducted under conditions effective to catalytically convert said silane monomer into hydridosiloxane and organohydridosiloxane resins. Recovery of the products is advantageously aided by the ease of separating the phase transfer catalyst from the dual phase reaction mixture by separating the immiscible polar solvent carrying the catalyst from the nonpolar solvent that carries the product. Hydridosiloxane and organohydridosiloxane resins produced by the processes of the invention are also provided.

18 Claims, No Drawings

SYNTHESIS OF SILOXANE RESINS

CROSS REFERENCE TO RELATED APPLICATION

This application claims the benefit of U.S. provisional application Ser. No. 60/044,480, filed Apr. 21, 1997. This application is a continuation-in-part of U.S. nonprovisional application Ser. No. 09/044,831, filed on Mar. 20, 1998, and U.S. nonprovisional application Ser. No. 09/044,798, filed Mar. 20, 1998, the disclosures of which are incorporated by reference herein in their entireties.

BACKGROUND OF THE INVENTION

1. Field of the Invention

The present invention relates to the preparation of substrates used in the manufacture of integrated circuits. In particular, the invention provides new and improved methods for preparing siloxane resins, including hydridosiloxanes and organohydridosiloxanes, that are free of the many disadvantages that previously attended the preparation of such materials. More particularly, the invention pertains to synthetic methods that employ phase transfer catalysts that avoid the disadvantages of previously employed catalytic systems that required hazardous catalytic reagents. The invention also pertains to synthetic methods that avoid the need for additional washing and purification steps that have heretofore been believed to be required to produce such resins.

2. Description of the Prior Art

It is known in the art that siloxane based resins are useful in the electronic and semiconductor fields to coat silicon chips and other similar components. Such coatings protect the surface of substrates and form dielectric layers between electric conductors on integrated circuits. Such coatings can be used as protective coatings, interlevel dielectric layers, doped dielectric layers to produce transistor like devices, pigment loaded binder systems containing silicon to produce capacitor and capacitor like devices, multilayer devices, 3-D devices, silicon on insulator devices, coatings for superconductors, superlattice devices and the like. These resins include hydridosiloxanes and organohydridosiloxanes containing a significant portion of organic moieties.

The production of siloxane resins, such as silsesquioxane resins, is well known in the art. For example, U.S. Pat. No. 5,486,564 describes the production of polyhydrogensilsesquioxane resins for electronic coatings. However, the process employs dangerous fuming sulfuric acid/sulfuric acid as a catalyst to produce polyhydrogensilsesquioxane. The product was contaminated with significant levels of trace metals despite washing in multiple steps with water containing decreasing percentages of sulfuric acid, followed by removal of all traces of water by azeotropic distillation. In an attempt to remedy these shortcomings, U.S. Pat. No. 5,416,190 describes fractionation of the silsesquioxane product using polar and nonpolar solvents. Other attempts to remedy these deficiencies in the production of silsesquioxane compounds employed supercritical fluid extraction in the purification process, as described by U.S. Pat. No. 5,063,267 and employed funming/concentrated sulfuric acid but with $CaCO_3$ neutralization, as described by U.S. Pat. No. 5,010,159.

It is also known that the dielectric constant of such insulating films is an important factor where integrated circuits or IC's with low power consumption, cross-talk, and signal delay are required. As IC dimensions continue to shrink, this factor increases in importance. As a result, siloxane based resin materials, and methods for making such materials, that can provide insulating films with dielectric constants below 3.0 are very desirable. In addition, it would be desirable to have siloxane-based resins, and methods for making the resins, that provide such low dielectric constant films and which additionally have a high resistance to cracking. It would also be desirable for such films to have low stress when formed in thickness of approximately 1.0 micron ($\mu$m) or greater. Additionally, it would be desirable for such siloxane-based resins, and methods for making, to provide low dielectric constant films via standard processing techniques. In this manner curing processes that require an ammonia or ammonia derivative type of atmosphere (See, U.S. Pat. No. 5,145,723, Sep. 8, 1992, Ballance et al.), an ozone atmosphere (See, U.S. Pat. No. 5,336,532, Haluska et al.), or other non-standard type of semiconductor process, are avoided.

Thus, it would be desirable to produce useful siloxane coating compositions, such as hydridosiloxane and organohydridosiloxane resins, by methods which are both efficient and which do not employ toxic catalytic reagents. It has now surprisingly been found that a reaction employing a phase transfer catalyst will produce the desired siloxane resins while avoiding all of the above described shortcomings of previous methods.

SUMMARY OF THE INVENTION

The processes of the invention provide for production of siloxane resins such as, for example, hydridosiloxanes and hydridosilsesquioxanes as well as organohydridosilsesquioxanes and organohydridosiloxanes, in high yield, by catalyzing the hydrolysis and condensation of a monomer precursor having the general formula of $R^1SiX_3$. In this formula, X is a halogen or $OR^2$, and $R^1$ and $R^2$ are independently H or an alkyl or aryl functional group. When $R^1$ and/or $R^2$ is not H, either or both is independently a substituted or unsubstituted, straight or branched alkyl group, cycloalkyl group and/or aryl group, or a combination thereof. Thus, one, or optionally more than one, kind of phase transfer catalyst is employed in the hydrolysis and condensation of the above-described starting compounds, or monomeric precursors, to form desired siloxane resins.

The processes of the invention therefore include the steps of contacting a silane monomer with a phase transfer catalyst in the presence of a reaction mixture comprising a nonpolar, e.g., hydrocarbon, solvent, a polar solvent, e.g., alcohol and water, under conditions effective to catalytically convert said silane monomer into hydridosiloxanes and organohydridosiloxanes; and thereafter recovering the produced hydridosiloxanes and organohydridosiloxanes.

The processes of the invention are preferably conducted employing a dual phase solvent system. Further, the process is preferably conducted while protected from atmospheric oxygen, e.g., the reaction is conducted in a container that has been purged of oxygen and that is maintained in a flow of an inert gas, e.g., nitrogen gas ($N_2$). In particular, the process is conducted by adding one or more monomer precursors, as described above, such as, trichlorosilane and/or one or more organotrichlorosilanes, or other art-known silane monomers, to a mixture that includes, but is not limited to, a phase transfer catalyst, a hydrocarbon solvent, alcohol and water. Once the reaction is complete, the reaction mixture is e.g., filtered, settled or centrifuged to remove any filterable impurities or precipitants and the phase transfer catalyst is removed by phase separation, e.g., by separation of the aqueous phase. The remaining hydrocarbon solvent, e.g., hexane, is then dried and evaporated to leave the product, typically a white solid. Thereafter, the recovered solid may optionally be slurried in a suitable hydrocarbon solvent to remove residual low molecular weight components, and then the solvent evaporated to leave desired product. The resulting product can be formulated in a suitable solvent for use as a spin-on polymer by methods well known to the art.

The weight average molecular weight ("Mw") of the produced polymer can range from about 400 to about 300,000 atomic mass units ("amu"). In another embodiment, the Mw of the produced polymer can range from about 10,000 to about 80,000 amu, depending on the reaction conditions. In a more particular embodiment, the Mw of the produced polymer can range from about 4,500 to about 75,000 amu. Simply by way of example and with no limitation intended, it has been confirmed that materials produced by the methods of the invention having, e.g., Mw's of about 20,000, about 40,000 and about 60,000 amu have good coating properties.

Thus, the invention provides methods for producing useful siloxanes, such as hydridosiloxanes and organohydridosiloxanes, using suitable starting materials and solvents. In particular, it has surprisingly been discovered that the processes of the invention are efficiently catalyzed by a phase transfer catalyst. Catalysts according to the invention include quaternary ammonium salts ($R_4N^+$ $X^-$). Advantageously, quaternary ammonium salts are soluble in polar, e.g., aqueous solvents, and are also slightly soluble in nonpolar, e.g., hydrocarbon or organic solvents.

DETAILED DESCRIPTION OF THE PREFERRED EMBODIMENT

Accordingly, the invention provides for novel and unexpected processes for preparing useful compounds, e.g., resins, as described above. In addition, while the invention is described with reference to various embodiments, it should be understood that these embodiments are presented as examples and not limitations of this invention. Thus, various modifications or adaptations of the specific materials and methods may become apparent to those skilled in the art. All such modifications, adaptations or variations that rely upon the teachings of the present invention as illustrated by the embodiments herein, are considered to be within the spirit and scope of the present invention.

PRECURSORS

Any precursor conforming to the general formula given above may be employed in the process of the invention. Thus, the precursor is generally $R^1SiX_3$, wherein X is a halogen or $OR^2$, and $R^1$ and $R^2$ are independently H or an alkyl or aryl functional group and when $R^1$ and/or $R^2$ is not H, either or both is independently a substituted or unsubstituted, straight or branched alkyl group, cycloalkyl group and/or aryl group, or a combination thereof. Thus, in one embodiment X is a halogen, and preferably is chlorine. More preferably, the three X moieties are the same, e.g., $HSiCl_3$. In another preferred embodiment, $R^1$ is as described above and X is $OR^2$, wherein $R^2$ is an alkyl and/or aryl substituent chosen to provide the desired reaction product. Simply by way of example, $R^2$ alkyl substituents are $C_1$ through $C_{20}$, or more, in size, and may be straight chain, branched or cyclic in form. Aryl substituents can, in turn, include straight or branched alkyl, aryl and heteroaryl substituents that are preferably $C_5$ through $C_{20}$, or greater, in size, and are themselves, in turn, optionally alkyl and/or aryl substituted. In a preferred embodiment, all $R^2$'s are the same and, in another preferred embodiment, are all $C_2H_5$—. In other optional embodiments, X is $X_1$, $X_2$ and $X_3$ and each of $X_1$, $X_2$ and $X_3$ is independently selected from a halogen and/or $OR^2$, wherein $R^2$ is defined as above. Examples of silane precursors useful according to the invention include, but are not limited to, trichlorosilane, methyltrichlorosilane, ethyltrichlorosilane, propyltrichlorosilane, n-butyltrichlorosilane, cyclohexyltrichlorosilane, phenyltrichlorosilane, and triethoxysilane, to name but a few. Of course, the artisan will appreciate that any other art-known silane monomers and/or derivatives may be employed as precursors in the processes of the invention and that, optionally, the precursors may be employed singly or in combination, depending on the desired end product.

SOLVENTS

Any suitable solvent systems may be used in the processes of the invention. Preferably, the processes of the invention employ a dual phase solvent system that includes a continuous phase non-polar solvent and a polar solvent.

Non-Polar Solvents

Non-polar solvents employed in the processes of the invention include, but are not limited to, any suitable aliphatic or aromatic compounds or a mixture of any or all such suitable compounds, the operational definition of "suitable" in the present context includes the functional characteristics of:

1) solubilizing the precursor, e.g., monomeric trihalosilane compounds,
2) solubilizng the polymeric products as they are formed and increase in molecular weight during the reaction process,
3) stabilizing the polymeric products in the solvent, and
4) rendering unwanted reaction products insoluble in the non-polar solvent for ease of removal.

Exemplary non-polar solvents include, but are not limited to, pentane, hexane, heptane, cyclohexane, benzene, toluene, xylene, halogenated solvents such as carbon tetrachloride and mixtures thereof Polar Solvents The polar phase of the solvent is substantially immiscible with the non-polar solvent phase, and includes any suitable art-known polar solvents, including, but not limited to, water, alcohols, and water alcohol mixtures. The amount of alcohol present is preferably sufficient to ensure solubility of the reactive intermediates. In particular, exemplary alcohols and other polar solvents suitable for use in the polar phase include, but are not limited to, water, methanol, ethanol, isopropanol, glycerol, diethyl ether, tetrahydroflran, diglyme and mixtures thereof In one embodiment, the polar solvent includes a water/alcohol mire wherein the water is present in an amount sufficient to preferentially solubilize ionic impurities not soluble in alcohol, and/or preclude solvent extraction of product compounds that might otherwise be soluble in alcohol. The polar solvent phase advantageously retains the hydrochloric acid (HCl) condensation product and any metal salt or other ionic contaminants, that may be present. As essentially all ionic contaminants are retained in the polar solvent phase, the hydridosiloxane and/or organohydridosiloxane product of this invention is of high purity and contains essentially no ionic contaminants.

It has been found that a polar solvent to non-polar solvent ratio of between about 5 percent weight to weight (% w/w) to 80% w/w is desirable and between about 9% w/w to about 40% w/w is preferred.

PROCESSES

In order to protect the reaction mixture from exposure to atmospheric oxygen, the reaction is preferably conducted while isolated from the atmosphere by a suitable enclosure and/or a protective flow of a sufficient quantity of any nonreactive, i.e., chemically inert gas, e.g., helium, argon and nitrogen gas. For the instant processes, nitrogen gas is generally preferred as the most cost effective. Further, the reaction vessel is preferably purged of atmospheric contaminants, i.e., oxygen, by a flow of inert gas, prior to commencing the reaction process. More preferably, e.g., when the reaction takes place in an open-top vessel, a blanket of flowing inert gas is maintained over the reaction mixture during the reaction process.

In conducting the reaction process of the invention, a silane precursor, e.g., in certain embodiments a trichlorosilane, alone or in combination with one or more different silane precursors, is added to a mixture of catalyst, non-polar solvent, and polar solvent to form a reaction mixture. The polymerization reaction is allowed to proceed, preferably with mixing. Upon completion of the polymerization reaction, the reaction mixture is, e.g., filtered to remove undesirable precipitates, the polar solvent is separated, carrying away the soluble phase transfer catalyst, and the solution is dried and then evaporated to leave a white solid. This solid is then optionally slurried in a hydrocarbon solvent to remove residual low molecular weight material, and finally evaporated to leave the desired product. The so-produced siloxane polymers are suitable for any art-known use, such as formulation in a suitable solvent for use as a spin-on-dielectric film.

The processes of the invention may be conducted at any appropriate temperature, ranging, simply by way of example, from about 10° C. to about 40° C. For example, the reaction may be conducted in an externally heated or cooled reaction vessel, such as, e.g., a water-jacketed reaction vessel. The artisan will appreciate that reaction temperatures will vary depending on the levels of exothermic energy release (when present) of any particular desired reaction process. Thus, the reaction vessel is optionally cooled or heated to achieve an optimal range of reaction temperature, as determined by the time-course and yield—as evidenced by routine testing of a particular desired process. Preferably, the inventive processes are conducted at room temperature, which is generally considered to be about 25° C.

REACTION TIMES

The processes of the invention are optionally conducted for a wide range of time durations. Essentially, the longer that the reaction mixture is stirred, the higher will be the Mw of the product produced by that reaction, when all other parameters are constant. Simply by way of example, the reaction processes of the invention are conducted for a time ranging from about 1–4 minutes to about 12 hours, or more.

CATALYSTS

It has unexpectedly been found that the processes of the invention are catalyzed by phase transfer catalysts, e.g., quaternary ammonium salts ($R_4N^+X^-$) that are soluble in aqueous or polar solvents, and are also slightly soluble in nonpolar, e.g., hydrocarbon or organic solvents. This solubility allows the catalyzed reaction process being conducted in a dual phase solvent system to occur not just at the interface of the two solvent phases, but also in the nonpolar or organic solvent layer. The quaternary ammonium salts are basic catalysts and catalyze the hydrolysis and condensation reactions of the silane precursors employed in the processes of the invention, e.g., catalyzing the reaction of chlorosilanes to form the desired siloxane resins according to the invention. Any catalytically active, art known quaternary ammonium salt or salts may be employed in the processes of the invention. Thus, for a quaternary ammonium salt having the structure of $R_4N^-X^-$, each R can be the same or different, and each R can independently be straight alky, branched alkyl, cycloalkyl, aryl and/or a combination or variation of these features. Each R can be of any size suitable for the purpose, provided that the resulting quaternary ammonium salt remains soluble in polar, e.g., aqueous solution and sparingly soluble in nonpolar, e.g., hydrocarbon solution and retains useful catalytic activity. X is any suitable anionic moiety, e.g., including halogen and sulfates, to name but few.

The artisan will appreciate that the amount or concentration of catalyst will depend, for example, upon the particular reaction to be catalyzed, the particular catalyst selected and the desired product molecular weight range and yield of that desired product.

Generally, and simply by way of example, the quaternary ammonium salts will be present in the reaction mixture in catalytically effective amounts, e.g., in a ratio of catalyst to silane precursor ranging from about 0.1 to about 10 percent (mol/mol) or in a ratio of catalyst to silane precursor ranging from about 0.1 to about 5 percent (mol/mol). Of course, these amounts will be routinely varied depending upon the particular reaction conditions of interest.

The Examples below provide confirmation of the catalytic utility of several quaternary ammonium salts in the processes of the invention. The artisan will appreciate that other quaternary ammonium salts will be readily employed in conducting the processes of the invention. For example, the catalytic properties of additional quaternary ammonium salts are readily determined by conducting the desired reaction process in the presence of a quaternary ammonium salt of interest and assaying for production of the desired siloxane resins by art known methods, as illustrated in the Examples given below. In any event, suitable quaternary ammonium salts for catalytic use in the processes of the invention include, for example, the chlorides of tetrabutylammonium, benzyltrimethylammonium, tetraethylammonium, benzyltributylammonium, cetyltrimethylammonium, as well as tetrabutylammonium bromide, methyltrioctylammonium bromide and others too numerous to mention. Preferably, tetrabutylammonium chloride and benzyltrimethylammonium chloride are used to catalyze the inventive processes.

POLYMERS PRODUCED BY THE PROCESSES OF THE INVENTION

Polymers usefuilly produced by the processes of the invention include, simply by way of example and without limitation, hydridosiloxane e.g., hydridosilsesquioxanes and organohydridosiloxane resins such as, for example, hydridomethylsiloxane, hydridoethylsiloxane, hydridopropylsiloxane, hydridobutylsiloxane, hydridotert-butylsiloxane, hydridophenylsiloxane, hydridomethylsilsesquioxane, hydridoethylsilsesquioxane, hydridopropylsilsesquioxane, hydridobutylsilsesquioxane, hydridotert-butylsilsesquioxane and hydridophenylsilsesquioxane, to name but a few. Thus, the hydridosiloxane resins produced by the processes of the present invention can have, e.g., one of the following six general formulas:

| | |
|---|---|
| $(H_{0.4-1.0}SiO_{1.5-1.8})_p$ | Formula 1 |
| $(HSiO_{1.5})_n(SiO_2)_w$ | Formula 2 |
| $(HSiO_{1.5})_n(R^1SiO_{1.5})_m$ | Formula 3 |
| $(H_{0.4-1.0}SiO_{1.5-1.8})_n(R^1{}_{0.4-1.0}SiO_{1.5-1.8})_m$ | Formula 4 |
| $(H_{0-1.0}SiO_{1.5-2.0})_n(R^1SiO_{1.5})_m$ | Formula 5 | wherein:

p is an integer ranging in value from about 8 to about 5000;

the sum of n and w is an integer ranging in value from about 8 to about 5000;

the sum of n and m is from about 8 to about 5000, and m is selected such that the organic substituent is present from about 1 to about 99 Mole percent (Mol %), or greater. In another embodiment, m is selected such that the organic substituent is present in an amount ranging from about 4 to about 40 Mole percent (Mol %). In yet another embodiment, m is selected such that the organic substituent is present in an amount ranging from about 4 to about 20 Mole percent (Mol %). In yet a further emdodiment m is selected such that the organic substituent is present in an amount ranging from about 40 Mol percent to about 90 Mol percent.

Formula 6 wherein:

the sum of x, y and z is from about 8 to about 5000 and y is selected such that the organic substituent is present up is selected such that the organic substituent is present from about 1 to about 99 Mole percent (Mol %), or greater. In another embodiment, y is selected such that the organic substituent is present in an amount ranging from about 4 to about 40 Mole percent (Mol %). In yet another embodiment, y is selected such that the organic substituent is present in an amount ranging from about 4 to about 20 Mole percent (Mol %). In yet a further emdodiment y is selected such that the organic substituent is present in an amount ranging from about 40 Mol percent to about 90 Mol percent.

In a further embodiment, $R^1$ is selected from substituted and unsubstituted organic groups including normal and branched alkyl groups, cycloalkyl groups, aryl groups, and mixtures thereof; and the specific Mol % of organic or carbon containing substituents is a function of the ratio of the amounts of starting materials.

In some embodiments of the inventive processes, the product will have substituted and unsubstituted normal and branched alkyl groups having between about 1 and 20 carbons; the product will have substituted and unsubstituted cycloalkyl groups having between about 4 and 10 carbons and the product will have substituted and unsubstituted aryl groups have between about 6 and 20 carbons.

For example, where $R^1$ is an alkyl group, $R^1$ includes, but is not limited to, methyl, chloromethyl and ethyl groups, and the normal and branched propyl, 2-chloropropyl, butyl, pentyl and hexyl groups. Where $R^1$ is a cycloalkyl group, $R^1$ includes but is not limited to cyclopentyl, cyclohexyl, chlorocyclohexyl and cycloheptyl groups; where R is an aryl group, R includes but is not limited to phenyl, naphthyl, tolyl and benzyl groups. It will be understood, that the specific carbon content of any specific organohydridosiloxane resin, in accordance with this invention, is a function of the mole ratio of organotrihalosilane(s) to hydridotrihalosilane starting materials employed.

Advantageously, products produced by processes in accordance with the present invention are polymers having a caged structure with a polymer backbone encompassing alternate silicon and oxygen atoms. In particular, each backbone silicon atom is bonded to at least three backbone oxygen atoms to form the aforementioned cage structure. Essentially all additional silicon bonds are only to hydrogen and the organic substituents, when present, defined in Formulae 1, 2, 3, 4, 5 and 6. Thus, polymers of the present invention have essentially no hydroxyl or alkoxy groups bonded to backbone silicon atoms and cross-linking reactions are suppressed.

In contrast, previously known organosiloxane resins had high levels of alkoxy groups bonded to backbone silicon atoms, thus significant hydrolysis to form silanol groups was observed. This hydrolysis resulted in higher dielectric constants for the as-cured polymer films formed from those previously known resins, as well as reduced shelf life of solutions of these resins. The latter effect was reported to be caused by unwanted chain lengthening and cross-linking.

Thus, the processes of the invention, by providing only hydrogen and organic groups directly bonded to backbone silicon atoms, advantageously avoids unwanted chain lengthening and cross-linking caused by condensation of the hydroxyl or silanol groups. Consequently, in an additional benefit, the shelf life of solutions of organohydridosiloxane resins produced by the processes of the invention is significantly prolonged over similar resin solutions produced by previously employed processes.

YIELDS

The polymer component is generally produced by the inventive processes in an amount ranging from about 20% to about 90% Mol. percent of the starting materials. In particular, the product is produced at a yield ranging from about 35 to about 75% Mol. percent of the starting materials.

POLYMER APPLICATIONS

The following characteristics encompass non-limiting measurements that illustrate the properties of the above-described organohydridosiloxane polymer resins produced by the novel processes of the present invention. The methods of measurement used are as follows:

1) Film Thickness (A): Film thickness is measured using a calibrated Nanospec® AFT-Y CTS-102 model 010–180 Film Thickness Measurement System available from Nanometrics, Co. An average of measurements at five locations on a wafer are reported as the film thickness for each sample.

2) Molecular Weight ("MW"): Molecular weight is determined referenced to polystyrene standards using a gel phase chromatography ("GPC") system from Waters Corporation, Milford, Mass., equipped with a Waters 510 pump, Waters 410 differential refractometer and a Waters 717 autosampler. The procedure used is as set forth by S. Rosen in "Fundamental Principles of Polymeric Materials, pages 53–81, (2nd Ed. 1993) and incorporated herein by reference.

EXAMPLES

The following non-limiting examples serve to illustrate the invention.

Example 1

Synthesis Of Hydridosiloxane Resin

A 1 L jacketed reactor equipped with a nitrogen inlet, dry ice condenser and a mechanical stirrer was charged with 1000 ml hexanes. In a beaker, 80 ml ethanol, 25 ml water and 2.0 g tetrabutylammonium chloride, as catalyst, were mixed until all solids were dissolved. This mixture was added to the hexane in the reactor and equilibrated for 0.5 hr with stirring at 25 ° C. Trichlorosilane (69 ml, 0.68 mol) was added to the reactor using a peristaltic pump over a period of 30 minutes. Upon completion of the silane addition, hexane was pumped through the lines for 10 minutes. The reaction was stirred for 21 h, then filtered though a Whatman

4 filter. The filtered solution was placed in a separatory finnel and the water/ethanol layer was then removed. The hexane solution was dried over 4 Å molecular sieves (170 g) for 3 h and then filtered through a 1 μm filter. The hexanes were removed using a rotary evaporator to give a white solid product (15.3 g) in a 52% yield. The GPC of this product, referenced to polystyrene standards, gave an Mw=23,019.

Example 2

Synthesis Of Methylhydridosiloxane Resin

A 1 L jacketed reactor equipped with a nitrogen inlet, dry ice condenser and a mechanical stirrer was charged with 1000 ml hexanes. In a beaker, 80 ml ethanol, 42.7 ml water and 1.0 g tetrabutylammonium chloride, as catalyst, were mixed until all solid was dissolved. This mixture was added to the hexane in the reactor and equilibrated for 0.5 hr with stirring at 25° C. A mixture of trichlorosilane (114.7 ml, 1.136 mol) and methyltrichlorosilane (33.3 ml, 0.284 mol) were added to the reactor using a peristaltic pump over a period of 90 minutes. Upon completion of the silane addition, hexane was pumped through the lines for 10 minutes. The reaction was stirred for 2 hr 50 min., then filtered though a Whatman #4 filter. The filtered solution was placed in a separatory funnel and the water/ethanol layer was removed. The hexane solution was dried over 4 Å molecular sieves (220 g) for 3 h and then filtered through a 1 μm filter. The hexanes were removed using a rotary evaporator to give a white solid product (37.8 g) in a 56% yield. The GPC of this product, referenced to polystyrene standards, gave an Mw=25,179, Mn=1216, and a polydispersity of 20.7.

Example 3

Synthesis Of Methylhydridosiloxane Resin

A 1 L jacketed reactor equipped with a nitrogen inlet, dry ice condenser and a mechanical stirrer was charged with 1000 ml hexanes. In a beaker, 80 ml ethanol, 50 ml water and 4.0 g tetrabutylammonium chloride, as catalyst, were mixed until all solid was dissolved. This mixture was added to the hexane in the reactor and equilibrated for 0.5 hr with stirring at 25 ° C. A mixture of trichlorosilane (114.7 ml, 1.136 mol) and methyltrichlorosilane (33.3 ml, 0.284 mol) was added to the reactor using a peristaltic pump over a period of 90 minutes. Upon completion of the silane addition, hexane was pumped through the lines for 10 minutes. The reaction was stirred for 1 h, then filtered though a Whatman #4 filter. The filtered solution was placed in a separatory funnel and the water/ethanol layer was removed. The hexane solution was dried over 4 Å molecular sieves (220 g) for 2.5 h and then filtered through a 1 μm filter. The hexanes were removed using a rotary evaporator to give a white solid product (24.2 g) in a 36% yield. The GPC of this product, referenced to polystyrene standards, gave an Mw=7,508, Mn=743, and a polydispersity of 10.1.

Example 4

Synthesis of Methylhydridosiloxane Resin

A 6 L jacketed reactor equipped with a nitrogen inlet, dry ice condenser and a mechanical stirrer was charged with 4500 mL hexanes, 720 ml ethanol, 63 mL water and 180 g of a 10% by weight of the benzyltrimethylammonium chloride catalyst in water. This mixture was equilibrated for 0.5 hr with stirring at 25° C. A mixture of trichlorosilane (96 g, 0.7 mol) and methyltrichlorosilane (471 g, 3.15 mol) was added to the reactor using a peristaltic pump over a period of 73 minutes. Upon completion of the silane addition, hexane was pumped through the lines for 10 minutes. The reaction was stirred for 15.3 hours, the ethanol/$H_2O$ layer was removed, and then the hexane solution was filtered through a 3 micron filter, followed by filtration through a 1 micron filter. The filtered solution was dried by flowing through a column of 4 Å molecular sieves (800 g) for 2.5 h and then filtered through a 0.05 μm filter. The hexanes were removed using a rotary evaporator to give a white solid product (161 g), 52% yield. The GPC of this product, referenced to polystyrene standards, gave an Mw=29,251, Mn=2595, with a polydispersity of 11.27.

Example 5

Synthesis of Methylhydridosiloxane Resin

A 6 L jacketed reactor equipped with a nitrogen inlet, dry ice condenser and a mechanical stirrer was charged with 4500 mL hexanes 720 ml ethanol, 63 mL water and 180 g of a 10% by weight tetrabutylammonium chloride catalyst in water. This mixture was equilibrated for 0.5 hr with stirring at 25° C. A mixture of trichlorosilane (96 g, 0.7 mol) and methyltrichlorosilane (471 g, 3.15 mol) were added to the reactor using a peristaltic pump, over a period of 73 minutes. Upon completion of the silane addition, hexane was pumped through the lines for 10 minutes. The reaction mixture was stirred for 15.3 hours, the ethanol/$H_2O$ layer is removed then the hexane solution is filtered through a 3 micron filter followed by a 1 micron filter. The filtered solution was then dried by flowing through a column of 4 Å molecular sieves (800 g) for 2.5 h and then filtered through a 0.05 μm filter. The hexanes were removed using a rotary evaporator to give a white solid product (225 g), 73% yield. The GPC of this product, referenced to polystyrene standards gave an Mw=33,589, M=2616, with a polydispersity of 12.84.

Example 6

Comparson of Exemplary Results

Table 1 below summarizes the results of the above Examples.

TABLE 1

| Example # | Product Mw | Mn | Polydispersity | % Yield | Catalyst |
|---|---|---|---|---|---|
| 1 | 23,019 | NA | NA | 52% | TBAC |
| 2 | 25,179 | 1216 | 20.7 | 56% | TBAC |
| 3 | 7,508 | 743 | 10.1 | 36% | TBAC |
| 4 | 29,251 | 2595 | 11.27 | 52% | BTAC |
| 5 | 33,589 | 2616 | 12.84 | 73% | TBAC |

TBAC: tetrabutylammonium chloride
BTAC: benzyltrimethylammonium chloride
NA: Data not available From the above Table, it can be appreciated that quaternary ammonium salts reliably catclyze the production of siloxane resins from silane monomer precursors to provide products with desirable molecular weight ranges and polydispersity, at good yields.

What is claimed is:

1. A process for preparing hydridosiloxane or organohydridosiloxane resins comprising the steps of
   a. contacting a silane monomer with a phase transfer catalyst in the presence of a reaction mixture comprising a nonpolar solvent and a polar solvent under conditions effective to catalytically convert said silane monomer into hydridosiloxane or organohydridosiloxane resins, wherein said polar solvent comprises water and alcohol; and b. recovering said hydridosiloxane or organohydridosiloxane resins.

2. The process of claim 1 wherein said nonpolar and polar solvents form a dual phase solvent system.

3. The process of claim 1 wherein said silane monomer has the general formula of $R^1SiX_3$, wherein X is a halogen or $OR^2$, and $R^1$ and $R^2$ are independently selected from the group consisting of H, an alkyl and an aryl moiety.

4. The process of claim 3 wherein $R^1$ and $R^2$ are moieties independently selected from the group consisting of H, straight akyl, branched alkyl, cycloalkyl, aryl and combinations thereof.

5. The process of claim 4 wherein said straight alkyl, branched alkyl, cycloalkyl, and aryl moieties are independently substituted or unsubstituted.

6. The process of claim 1 wherein said catalyst is a quaternary ammonium salt.

7. The process of claim 2 wherein said nonpolar solvent comprises a hydrocarbon solvent.

8. The process of claim 1 wherein step b further comprises the step of separating suspended materials from said reaction mixture and said hydridosiloxane or organohydridosiloxane resins.

9. The process of claim 8 wherein said suspended materials are separated from said reaction mixture by a method selected from the group consisting of filtration, centrifugation, gravity mediated settling of said suspended materials and combinations thereof.

10. The process of claim 3 wherein said silane monomer is selected from the group consisting of trichlorosilane, methyltrichlorosilane, ethyltrichlorosilane, propyltrichlorosilane, n-butyltrichlorosilane, cyclohexyltrichlorosilane, phenyltrichlorosilane, triethoxysilane, and combinations thereof.

11. The process of claim 3 wherein $R^1$ is a moiety selected from the group consisting of methyl, chloromethyl, ethyl, propyl, 2-chloropropyl, butyl, pentyl, hexyl, cyclopentyl, cyclohexyl, chlorocyclohexyl, cycloheptyl, phenyl, napthyl, tolyl, and benzyl.

12. The process of claim 3 wherein $R^1$ is a moiety selected from the group consisting of methyl, chloromethyl, ethyl, propyl, 2-chloropropyl, butyl, pentyl, hexyl, cyclopentyl, cyclohexyl, chlorocyclohexyl, cycloheptyl, phenyl, napthyl, tolyl, and benzyl and alkyl $R^1$ moieties are straight or branched.

13. The process of claim 1 wherein said hydridosiloxane or organohydridosiloxane resins are selected from the group consisting of hydridomethylsiloxane, hydridoethylsiloxane, hydridopropylsiloxane, hydridobutylsiloxane, hydridotert-butylsiloxane, hydridophenylsiloxane, hydridomethylsilsesquioxane, hydridoethylsilsesquioxane, hydridopropylsilsesquioxane, hydridobutylsilsesquioxane, hydridotert-butylsilsesquioxane and hydridophenylsilsesquioxane, and combinations thereof.

14. The process of claim 1 wherein said reaction mixture comprises a ratio of the polar solvent to the non-polar solvent ranging from about 5 percent to about 80 percent, calculated as weight to weight.

15. The process of claim 6 wherein said catalyst is selected from the group consisting of tetraethylammonium chloride, benzyltributylammonium chloride, tetrabutylammonium bromide, cetyltrimethylammonium chloride, methyltrioctylammonium bromide, tetrabutylammonium chloride, benzyltrimethylammonium chloride.

16. The process of claim 15 wherein said catalyst is selected from the group consisting of tetrabutylammonium chloride and benzyltrimethylammonium chloride.

17. The process of claim 1 wherein said hydridosiloxane or organohydridosiloxane resins are described by a formula selected from the group consisting of:

$(H_{0.4-1.0}SiO_{1.5-1.8})_p$;

$(HSiO_{1.5})_n(SiO_2)_w$;

$(HSiO_{1.5})_n(R^1SiO_{1.5})_m$;

$(H_{0.4-1.0}SiO_{1.5-1.8})_n(R^1{}_{0.4-1.0}SiO_{1.5-1.8})_m$;

$(H_{0-1.0}SiO_{1.5-2.0})_n(R^1SiO_{1.5})_m$;

wherein:

p is an integer ranging in value from about 8 to about 5000;

the sum of n and w is an integer ranging in value from about 8 to about 5000;

the sum of n and m is an integer ranging in value from about 8 to about 5000; and m is selected such that the organic substituent is present at a Mole percent ranging from about 1 to about 99; and wherein $R^1$ is a moiety selected from the group consisting of straight alkyl, branched alkyl, cycloalkyl and aryl.

18. The process of claim 1 wherein said hydridosiloxane or organohydridosiloxane resins are described by the formula:

$(HSiO_{1.5})_x(R^1SiO_{1.5})_y(SiO_2)_z$, wherein:

the sum of x, y, and z is a number ranging from about 8 to about 5000 and y is selected such that the organic substituent is present in a Mole percent ranging from about 1 to about 99 Mole percent; and wherein $R^1$ is a moiety selected from the group consisting of straight alkyl, branched alkyl, cycloalkyl and aryl and $R^1$ is substituted or unsubstituted.

* * * * *